United States Patent [19]

Yamaguchi

[11] Patent Number: 5,285,418
[45] Date of Patent: Feb. 8, 1994

[54] SEMICONDUCTOR DEVICE HAVING A TEMPERATURE DETECTION CIRCUIT

[75] Inventor: Takashi Yamaguchi, Tokyo, Japan

[73] Assignee: NEC Corporation, Tokyo, Japan

[21] Appl. No.: 753,134

[22] Filed: Aug. 30, 1991

[30] Foreign Application Priority Data

Aug. 30, 1990 [JP] Japan .................. 2-29992

[51] Int. Cl.⁵ .................................. G11C 29/00
[52] U.S. Cl. ........................ 365/201; 365/211; 365/212
[58] Field of Search ............ 365/201, 211, 212; 323/369, 907, 354; 361/2, 8, 9; 307/296.1, 310, 117; 257/467; 315/308

[56] References Cited

U.S. PATENT DOCUMENTS

| | | | |
|---|---|---|---|
| 4,278,873 | 7/1981 | Petrides | 307/117 X |
| 4,730,228 | 3/1988 | Einzinger et al. | 307/310 X |
| 5,119,337 | 6/1992 | Shimizu et al. | 365/201 |

Primary Examiner—Eugene R. LaRoche
Assistant Examiner—Son Dinh
Attorney, Agent, or Firm—Sughrue, Mion, Zinn, Macpeak & Seas

[57] ABSTRACT

A semiconductor device is provided with an automatic voltage switching circuit which applies an internal, reduced power voltage to an internal other than when a burn-in test is performed. The semiconductor device comprises a temperature detection circuit for detecting a predetermined temperature used for the burn-in test and a switch circuit for applying the external power voltage to the internal circuit when the predetermined temperature is detected.

5 Claims, 3 Drawing Sheets

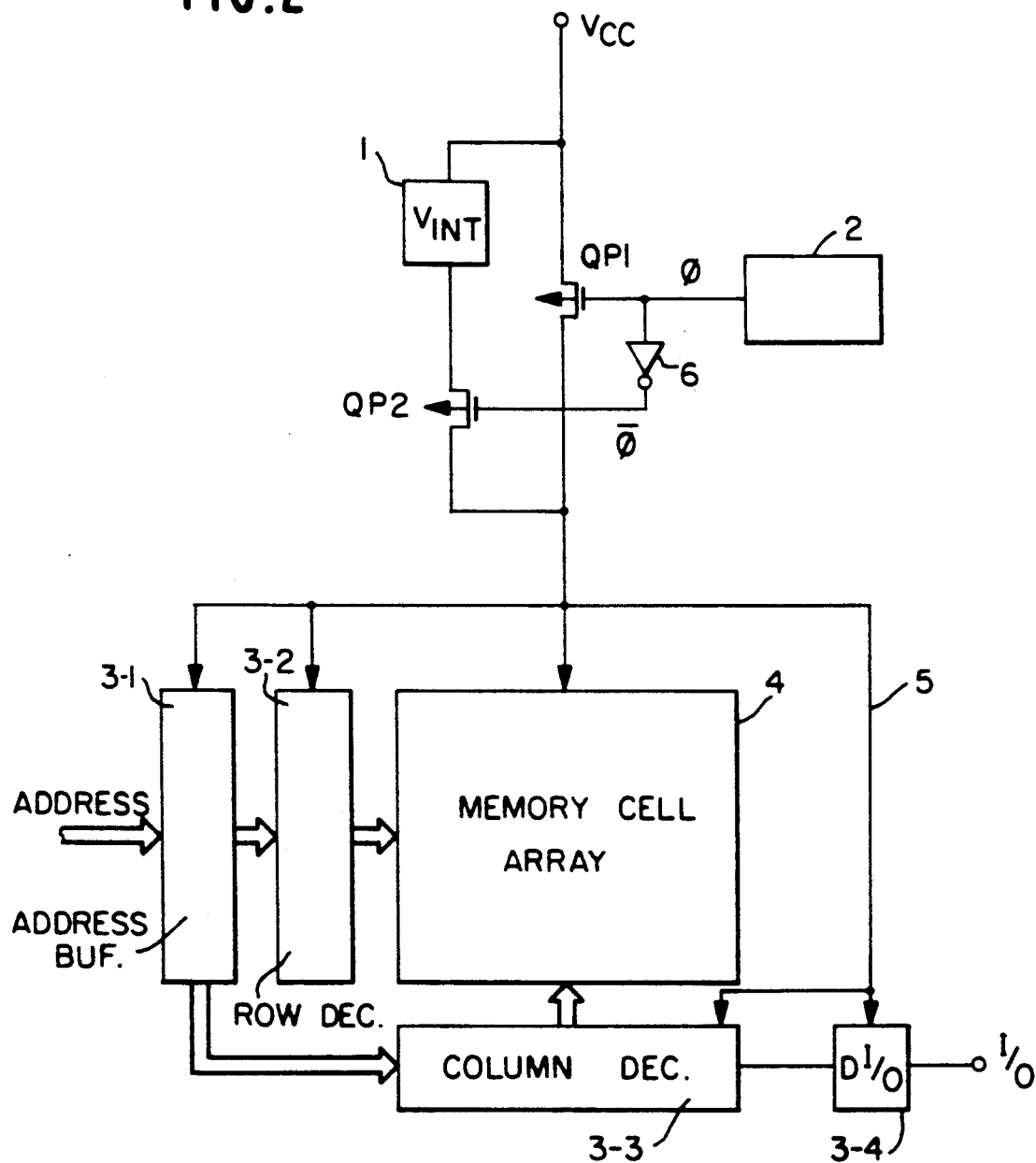

SEMICONDUCTOR DEVICE HAVING A TEMPERATURE DETECTION CIRCUIT

BACKGROUND OF THE INVENTION

The present invention relates to a semiconductor device, and more particularly to a semiconductor device having a built-in internal supply voltage step-down circuit for generating an internal supply voltage.

In recent years, semiconductor integrated circuits, especially semiconductor memory devices have increased the densities of integration owing to the progress of various relevant technologies. Up-to-date microfabrication techniques have been adopted for the semiconductor memory devices, the memory capacities of which have been quadrupled in three years. In this regard, in the semiconductor memory device such as 4-megabit static RAM (4MSRAM) or 16-megabit dynamic RAM (16MDRAM), the deteriorations of transistor performances attributed to hot electrons and degradation in a gate oxide film have become a serious problem with the microminiaturization of transistors. In order to prevent the deteriorations of the transistors, therefore, researches have been made on the use of the internal supply voltage of the semiconductor memory device that is stepped down from the external supply voltage thereof, and studies have been made on the mounting of an internal supply voltage step-down circuit in the semiconductor memory device.

The prior-art semiconductor memory device having such an internal supply-voltage step-down circuit is shown in FIG. 1. Referring to FIG. 1, the memory device is composed of a memory cell array 4 and as peripheral circuits, an address buffer 3-1, a row decoder 3-2, a column decoder 3-3 and an input/output circuit 3-4 in a known manner. The memory device further comprises a supply-voltage step-down circuit 1 which receives an external power voltage Vcc which is usual set at 5 V and generates a reduced value of an internal supply voltage $V_{INT}$, a value of which is typically 3 to 4 V. The internal voltage $V_{INT}$ is fed to an internal power supply wiring 5 coupled to the peripheral circuits 3-1 to 3-4 and the memory cell array 4. By stepping down the external supply voltage to the internal supply voltage of the semiconductor memory device in this manner, the deteriorations of the characteristics of the transistors can be prevented to realize a semiconductor device of high reliability.

Meanwhile, in general, when a semiconductor manufacturer has produced semiconductor devices, it sorts out the defective semiconductor devices in order to remove them before shipment. Further, it often performs a burn-in test (BT) in order to remove initial conductor device is exposed to high temperature (on the order of $+120°$ C.) and high voltage (on the order of $+7$ V) for a long time (several to several tens hours), thereby to remove initial defective units.

Since, however, the prior-art semiconductor memory device drops the external supply voltage therein and then uses the dropped voltage in order to ensure the reliabilities of the, transistors, the high voltage is lowered within the device even during the burn-in test described above, resulting in the problem that initial defective units cannot be effectively removed. In other words, it is almost impossible to directly apply the external supply voltage raised to the high voltage e.g. 7 V to the internal elements such as transistors during the burn-in test because there is inevitably the internal supply-voltage step-down circuit present between the external supply voltage terminal and the internal elements, and the internal supply-voltage step-down circuit produces the regulated or reduced value of the internal supply voltage to the internal elements.

BRIEF SUMMARY OF THE INVENTION

It is an object of the present invention to provide a semiconductor device which can directly apply an external supply voltage to internal elements when a burn-in test is performed.

The semiconductor device according to the present invention comprises an internal circuit, an internal supply voltage generator receiving an external supply voltage through an external supply voltage terminal and generating an internal supply voltage at its output end, a temperature sensing circuit for sensing an ambient temperature, and a connection circuit for connecting the internal circuit to the output end of the internal supply voltage generator when the ambient temperature is below a predetermined value and to the external supply voltage terminal when the ambient temperature is at the predetermined value or more. According to the present invention, when the semiconductor device is subjected to a burn-in test in which an ambient temperature is raised much higher than room temperature, this raised temperature is sensed by the temperature sensing circuit and, in response to the sense result, the external supply voltage terminal is activated by the connection circuit. Therefore, the high supply voltage can be automatically applied to the internal circuit during the burn-in test.

According to one aspect of the present invention, there is provided a semiconductor device having a supply-voltage step-down circuit which lowers a supply voltage externally fed and then feeds the lowered supply voltage to an internal circuit, an element which is connected between two voltage sources and of which electric characteristic changes according to an ambient temperature thereof, and a detector circuit which detects the change of the electric characteristic of the element and which has its output signal inverted when the ambient temperature has reached a predetermined temperature, thereby to cancel the function of said supply-voltage internal step-down circuit and to feed the externally-fed supply voltage to said internal circuits.

A change in the ambient temperature leads to a change in the electric characteristic of the element, and the detector circuit monitors this change. When the ambient temperature has reached the predetermined temperature, the output of the detector circuit is inverted. It can therefore be known from the output of the detector circuit that the ambient temperature has reached the predetermined one.

Besides, when the temperature detection circuit of such construction is built in a semiconductor device so as to control the function of the supply-voltage internal step-down circuit, the voltage to be fed to the other internal circuits during an ordinary operation can be changed from that during the burn-in test.

BRIEF DESCRIPTION OF THE DRAWINGS

The above-mentioned and other objects, features and advantages of the present invention will become more apparent by reference to the following detailed description of the present invention taken in conjunction with the accompanying drawings, wherein:

FIG. 2 is a block diagram illustrative of a semiconductor memory device according to the first embodiment of the present invention;

DETAILED DESCRIPTION OF THE PREFERRED EMBODIMENTS

Now, embodiments of the present invention will be described with reference to the drawings.

FIG. 2 illustrates a semiconductor memory device according to a first embodiment of the present invention.

In FIG. 2, the same constituents as in the prior-art example have the same numerals assigned thereto, and their description will be omitted. One difference from the prior-art example is the incorporation of a temperature detection circuit 2, a first switch formed of a P-channel MOS transistor QP1 coupled between the power supply terminal Vcc and the internal power supply line 5, and a second switch formed of a P-channel transistor QP2 and an inverter 6 for generating a signal $\bar{\phi}$ complementary to an output signal $\phi$ of the temperature detecting circuit 2.

Figure 1:
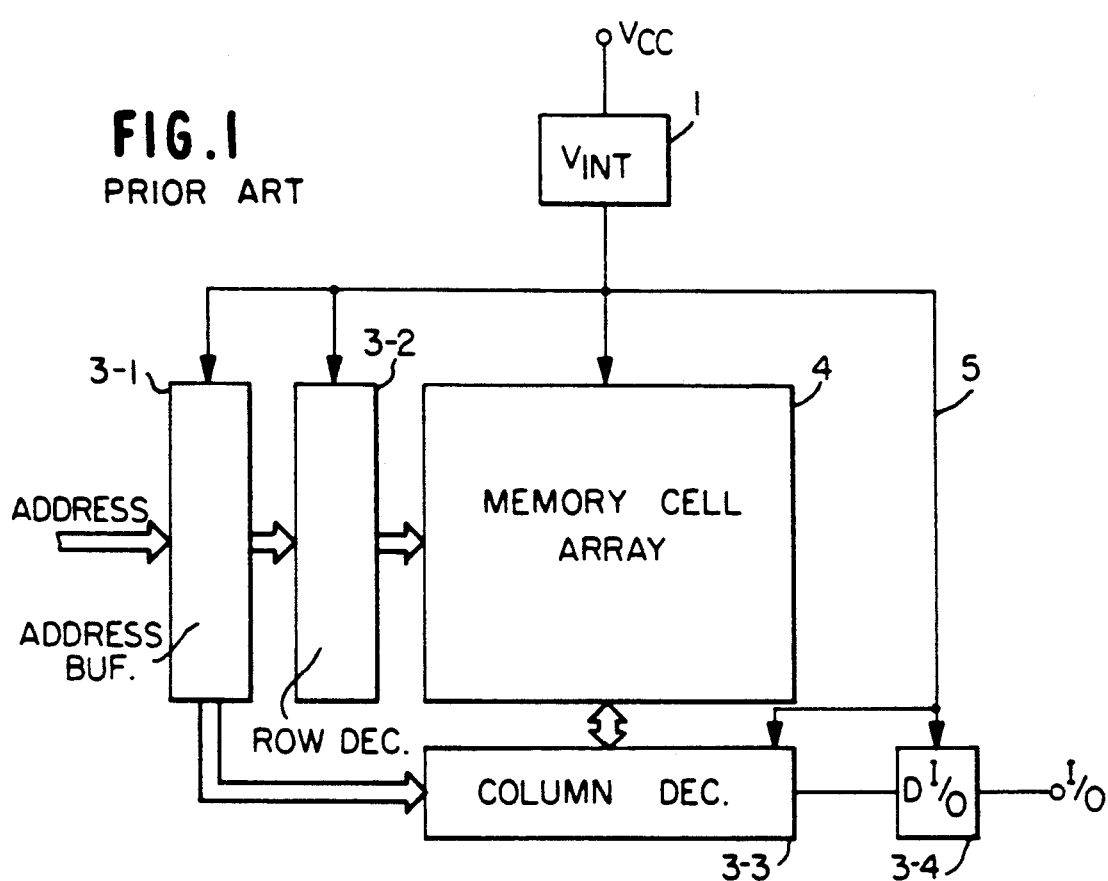
FIG. 1 is a block diagram showing a semiconductor device according to the prior art.
Figure 4:
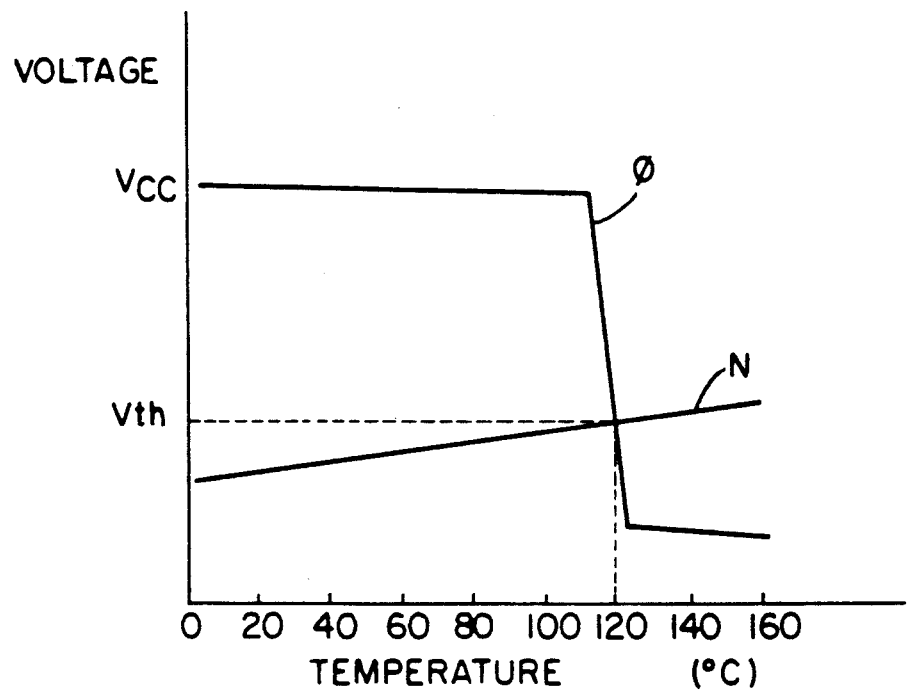
FIG. 4 is a graph showing the temperature dependency of the temperature detection circuit in the first embodiment.
Figure 3:
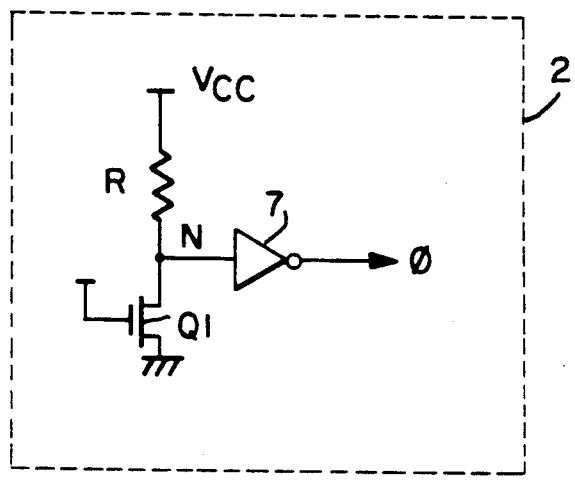
FIG. 3 is a circuit diagram of a temperature detection circuit in the first embodiment.

As shown in detail in FIG. 3, this temperature detection circuit 2 includes a resistance element R of large temperature coefficient such as of high-resistivity polycrystalline silicon, an N-channel type MOS transistor $Q_1$ which has its gate connected to a voltage source, its source to a ground node, and its drain to the resistance element R, and an inverter 7 which is connected to the node N between the resistance element R and the transistor $Q_1$ and which generates an output signal $\phi$. The voltage value of the node N is determined by the ratio between the resistance of the resistance element R and the on-resistance of the transistor $Q_1$. In this regard, since the resistance element R is made of the high-resistivity polycrystalline silicon or the like, the temperature coefficient thereof is very large, and the resistance value thereof becomes smaller extraordinarily at higher temperatures. Accordingly, the voltage of the node N rises with a temperature rise as shown in FIG. 4. Here, the temperature coefficient of the N-channel type MOS transistor $Q_1$1 is very small as compared with that of the resistance element R and is therefore negligible. Thus, it may well be considered that the temperature characteristic of the voltage of the node N is determined only by the temperature characteristic of the resistance element R.

In operation, when a normal operation is performed and the ambient temperature is at room temperature, e.g., below 120° C., the output signal $\phi$ of the detection circuit 2 is at a high (Vcc) level and therefore the signal $\bar{\phi}$ is at a low (ground) level. Therefore, the transistor QP2 is rendered conductive and the transistor QP1 is rendered non-conductive so that the the output of the internal supply-voltage step-down circuit 1, i.e., the internal supply voltage is applied to the internal power supply line 5.

When the burn-in test is conducted to the drive and the ambient temperature is raised above 120° C., the voltage of the node N has risen to reach the threshold voltage $V_{th}$ of the inverter 5, the output $\phi$ is inverted to the low level as shown in FIG. 4. Thus, the transistors QP1 and QP2 are rendered conductive and non-conductive, respectively, so that the supply-voltage 1 step-down circuit 1 is bypassed by the transistor QP1. In other words, in a case where the temperature at which the threshold voltage $V_{th}$ of the inverter 5 is reached is preset as the temperature (for example, 120° C.) of a burn-in test, the supply voltage step-down 1 can be cancelled only during the burn-in test, and a semiconductor memory device involving initial defects can be removed beforehand.

Now, a second embodiment of the present invention will be explained. This embodiment is achieved by employing a temperature detection circuit 2' shown in FIG. 5 in place of the detection circuit 2 of FIG. 3.

Figure 5:
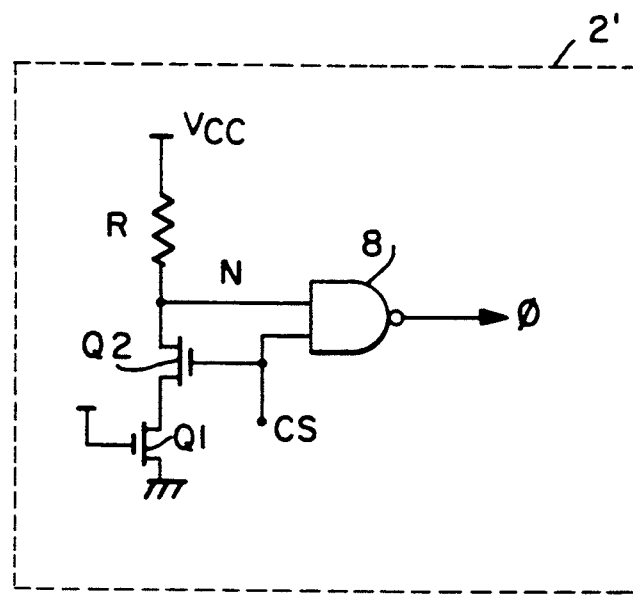
FIG. 5 is a circuit diagram showing the second embodiment of the present invention.

As shown in FIG. 5, this embodiment is featured in that an N-channel MOS transistor $Q_2$ is inserted between the node N and the transistor $Q_1$ and the inverter 5 is replaced with a NAND gate 8, and the transistor $Q_2$ and the NAND gate 6 are controlled by a chip-selector signal CS.

When the chip-select signal CS is at its high level, the operation of the circuit dependent upon the temperature is quite the same as with the temperature detection circuit 2 in the first embodiment, and hence, its description will be omitted. On the other hand, when the chip-select signal CS is at its low level, the transistor $Q_2$ is turned "off", and the signal $\phi$ from the NAND gate 8 is fixed at its high level. Accordingly, any through current does not flow at all in the temperature detection circuit 2' shown in FIG. 5, in a stand-by state of the memory device.

This embodiment has an advantage that current consumption can be rendered substantially zero merely by setting a chip-select internal signal CS at a low level.

Although, each of the embodiments has explained cancellation of the function of the supply voltage step-down circuit built in the memory device, the present invention is also applicable to variety of semiconductor device other than memory devices.

What is claimed is:

1. A semiconductor device comprising an internal circuit, an external voltage terminal for receiving an external supply voltage, a voltage reduction circuit having an input end coupled to said external voltage terminal and an output end for generating an internal voltage having a smaller value than said external supply voltage, a temperature detection circuit for generating a detection signal of a first level when an ambient temperature is below a predetermined value and a detection signal of a second level when the ambient temperature is at said predetermined value or more, and a selective switch circuit coupled to said external voltage terminal, said internal circuit, said voltage reduction circuit and said temperature detection circuit for providing a first current path between the output end of said voltage reduction circuit and said internal circuit when said detection signal is at said first level and providing a second current path between said external voltage terminal and said internal circuit to supply said external supply voltage to said internal circuit when said detection signal is at said second level.

2. The semiconductor device according to claim 1, in which said detection circuit includes a series circuit of a resistor made of polycrystalline silicon and a field effect transistor connected between said external voltage terminal and a reference voltage terminal.

3. A semiconductor device comprising an internal circuit, an external voltage terminal for receiving an external supply voltage, a voltage reduction circuit having an input end coupled to said external voltage terminal and an output end for generating an internal voltage having smaller value than said external supply voltage, a temperature detection circuit for generating a detection signal of a first level when an ambient temperature is below a redetermined value and a detection signal of a second level when the ambient temperature is at said predetermined value or more, and a selective switch circuit coupled to said internal circuit, said voltage reduction circuit and said temperature detection circuit for providing a first current path between the output end of said voltage reduction circuit and said internal circuit when said detection signal is at said first level and providing a second current path between said external voltage terminal and said internal circuit to supply said external supply voltage to said internal circuit when said detection signal is at said second level, said selective switch circuit including a first switch inserted between the output end of said voltage reduction circuit and said internal circuit and a second switch element inserted between said external voltage terminal and said circuit terminal.

4. The semiconductor device according to claim 3, wherein said temperature detection circuit includes a resistive element coupled between said external voltage terminal and a circuit node, first and second transistors coupled in series between said circuit node and a reference voltage terminal, and a gate circuit having a first input end coupled to said circuit node and a second input end supplied with a chip-select signal and producing said detection signal, said first transistor having a gate coupled to said external voltage terminal and said second transistor having a gate supplied with said chip-select signal.

5. The semiconductor device according to claim 4, wherein said gate circuit includes a NAND gate.

* * * * *

UNITED STATES PATENT AND TRADEMARK OFFICE
CERTIFICATE OF CORRECTION

PATENT NO. : 5,285,418
DATED : February 8, 1994
INVENTOR(S) : Takashi YAMAGUCHI

It is certified that error appears in the above-identified patent and that said Letters Patent is hereby corrected as shown below:

Column 2, line 5, after "voltage" insert --fed--.

Column 3, line 51, after "$Q_1$," delete "1".

Column 5, line 11, change "redetermined" to --predetermined--.

Signed and Sealed this

Nineteenth Day of July, 1994

Attest:

BRUCE LEHMAN

Attesting Officer     Commissioner of Patents and Trademarks